(12) United States Patent
Clark, Jr. et al.

(10) Patent No.: US 8,168,487 B2
(45) Date of Patent: May 1, 2012

(54) PROGRAMMABLE CONNECTION AND ISOLATION OF ACTIVE REGIONS IN AN INTEGRATED CIRCUIT USING AMBIGUOUS FEATURES TO CONFUSE A REVERSE ENGINEER

(75) Inventors: William M. Clark, Jr., Santa Barbara, CA (US); Lap Wai Chow, South Pasadena, CA (US); Gavin Harbison, Marina del Rey, CA (US); Paul Ouyang, San Jose, CA (US)

(73) Assignee: HRL Laboratories, LLC, Malibu, CA (US)

( * ) Notice: Subject to any disclaimer, the term of this patent is extended or adjusted under 35 U.S.C. 154(b) by 654 days.

(21) Appl. No.: 11/855,005

(22) Filed: Sep. 13, 2007

(65) Prior Publication Data

US 2008/0079082 A1    Apr. 3, 2008

Related U.S. Application Data

(60) Provisional application No. 60/848,204, filed on Sep. 28, 2006.

(51) Int. Cl.
*H01L 21/335* (2006.01)
(52) U.S. Cl. .......... 438/183; 257/E21.438; 257/E29.266
(58) Field of Classification Search .................. 257/408, 257/21.438, E29.266, 368, E21.538; 438/183, 438/514
See application file for complete search history.

(56) References Cited

U.S. PATENT DOCUMENTS

| | | |
|---|---|---|
| 3,673,471 A | 6/1972 | Klein et al. |
| 3,898,105 A | 8/1975 | Mai .............................. 438/276 |
| 3,946,426 A | 3/1976 | Sanders |
| 3,983,620 A | 10/1976 | Spadea .......... 438/218 |
| 4,017,888 A | 4/1977 | Christie et al. |
| 4,101,344 A | 7/1978 | Kooi et al. |
| 4,139,864 A | 2/1979 | Schulman |
| 4,143,854 A | 3/1979 | Vetter .............................. 254/93 |
| 4,145,701 A | 3/1979 | Kawagoe ...................... 257/391 |
| 4,164,461 A | 8/1979 | Schilling |

(Continued)

FOREIGN PATENT DOCUMENTS

EP    0 186 855    7/1986

(Continued)

OTHER PUBLICATIONS

Blythe, et al., "Layout Reconstruction of Complex Silicon Chips," IEEE Journal of Solid State Circuits, vol. 28, No. 2, pp. 138-145 (Feb. 1993).

(Continued)

*Primary Examiner* — Colleen Matthews
(74) *Attorney, Agent, or Firm* — Ladas & Parry

(57) ABSTRACT

A technique for and structures for camouflaging an integrated circuit structure and strengthen its resistance to reverse engineering. A plurality of transistors are formed in a semiconductor substrate, at least some of the transistors being of the type having sidewall spacers with LDD regions formed under the sidewall spacers. Transistors are programmably interconnected with ambiguous interconnection features, the ambiguous interconnection features each comprising a channel formed in the semiconductor substrate with preferably the same dopant density as the LDD regions, with selected ones of the channels being formed of a conductivity type supporting electrical communication between interconnected active regions and with other selected ones of the channels being formed of a conductivity type inhibiting electrical communication but ambiguously appearing to a reverse engineer as supporting electrical communication.

3 Claims, 4 Drawing Sheets

U.S. PATENT DOCUMENTS

| | | | |
|---|---|---|---|
| 4,196,443 A | 4/1980 | Dingwall | |
| 4,267,578 A | 5/1981 | Vetter | |
| 4,291,391 A | 9/1981 | Chatterjee et al. | |
| 4,295,897 A | 10/1981 | Tubbs et al. | |
| 4,314,268 A | 2/1982 | Yoshioka et al. | |
| 4,317,273 A | 3/1982 | Guterman et al. | |
| 4,322,736 A | 3/1982 | Sasaki et al. | |
| 4,374,454 A | 2/1983 | Jochems | |
| 4,393,575 A | 7/1983 | Dunkley et al. | 438/186 |
| 4,409,434 A | 10/1983 | Basset et al. | |
| 4,435,895 A | 3/1984 | Parrillo | |
| 4,471,376 A | 9/1984 | Morcom et al. | |
| 4,493,740 A | 1/1985 | Komeda | 438/431 |
| 4,530,150 A | 7/1985 | Shirato | |
| 4,581,628 A | 4/1986 | Miyauchi et al. | |
| 4,583,011 A | 4/1986 | Pechar | |
| 4,603,381 A | 7/1986 | Guttag et al. | |
| 4,623,255 A | 11/1986 | Suszko | |
| 4,636,822 A | 1/1987 | Codella et al. | 257/282 |
| 4,727,038 A | 2/1988 | Watabe | 438/304 |
| 4,727,493 A | 2/1988 | Taylor, Sr. | |
| 4,729,001 A | 3/1988 | Haskell | 257/345 |
| 4,753,897 A | 6/1988 | Lund et al. | |
| 4,766,516 A | 8/1988 | Ozdemir et al. | |
| 4,771,012 A | 9/1988 | Yabu et al. | 438/286 |
| 4,799,096 A | 1/1989 | Koeppe | |
| 4,814,854 A | 3/1989 | Tigelaar et al. | 257/382 |
| 4,821,085 A | 4/1989 | Haken et al. | |
| 4,829,356 A | 5/1989 | Arndt | 357/35 |
| 4,830,974 A | 5/1989 | Chang et al. | |
| 4,860,084 A | 8/1989 | Shibata | 257/288 |
| 4,912,053 A | 3/1990 | Schrantz | 438/188 |
| 4,927,777 A | 5/1990 | Hsu et al. | 438/305 |
| 4,931,411 A | 6/1990 | Tigelaar et al. | 438/201 |
| 4,939,567 A | 7/1990 | Kenney | |
| 4,962,484 A | 10/1990 | Takeshima et al. | |
| 4,975,756 A | 12/1990 | Haken et al. | |
| 4,998,151 A | 3/1991 | Korman et al. | |
| 5,015,596 A | 5/1991 | Toyoda et al. | 437/41 |
| 5,016,077 A | 5/1991 | Sato | 257/408 |
| 5,030,796 A | 7/1991 | Swanson et al. | |
| 5,050,123 A | 9/1991 | Castro | |
| 5,061,978 A | 10/1991 | Mizutani et al. | |
| 5,065,208 A | 11/1991 | Shah et al. | |
| 5,068,697 A | 11/1991 | Noda et al. | |
| 5,070,378 A | 12/1991 | Yamagata | |
| 5,073,812 A | 12/1991 | Shimura | |
| 5,101,121 A | 3/1992 | Sourgen | |
| 5,117,276 A | 5/1992 | Thomas et al. | |
| 5,120,669 A | 6/1992 | Schrantz | 437/41 |
| 5,121,089 A | 6/1992 | Larson et al. | |
| 5,121,186 A | 6/1992 | Wong et al. | |
| 5,132,571 A | 7/1992 | McCollum et al. | |
| 5,138,197 A | 8/1992 | Kuwana | |
| 5,146,117 A | 9/1992 | Larson | |
| 5,168,340 A | 12/1992 | Nishimura | |
| 5,177,589 A | 1/1993 | Kobayashi et al. | |
| 5,202,591 A | 4/1993 | Walden | |
| 5,210,437 A | 5/1993 | Sawada et al. | 257/392 |
| 5,225,699 A | 7/1993 | Nakamura | |
| 5,227,649 A | 7/1993 | Chapman | |
| 5,231,299 A | 7/1993 | Ning et al. | |
| 5,302,539 A | 4/1994 | Haken et al. | |
| 5,308,682 A | 5/1994 | Morikawa | |
| 5,309,015 A | 5/1994 | Kuwata et al. | |
| 5,317,197 A | 5/1994 | Roberts | |
| 5,336,624 A | 8/1994 | Walden | |
| 5,341,013 A | 8/1994 | Koyanagi et al. | |
| 5,345,105 A | 9/1994 | Sun et al. | |
| 5,354,704 A | 10/1994 | Yang et al. | |
| 5,369,299 A | 11/1994 | Byrne et al. | |
| 5,371,390 A | 12/1994 | Mohsen | |
| 5,371,443 A | 12/1994 | Sun et al. | 315/247 |
| 5,376,577 A | 12/1994 | Roberts et al. | |
| 5,378,641 A | 1/1995 | Cheffings | 438/302 |
| 5,384,472 A | 1/1995 | Yin | |
| 5,384,475 A | 1/1995 | Yahata | |
| 5,399,441 A | 3/1995 | Bearinger et al. | |
| 5,404,040 A | 4/1995 | Hshieh et al. | |
| 5,412,237 A | 5/1995 | Komori et al. | |
| 5,441,902 A | 8/1995 | Hsieh et al. | |
| 5,453,635 A | 9/1995 | Hsu et al. | 257/336 |
| 5,468,990 A | 11/1995 | Daum | |
| 5,475,251 A | 12/1995 | Kuo et al. | |
| 5,506,806 A | 4/1996 | Fukushima | |
| 5,510,279 A | 4/1996 | Chien et al. | 438/302 |
| 5,531,018 A | 7/1996 | Saia et al. | |
| 5,539,224 A | 7/1996 | Ema | |
| 5,541,614 A | 7/1996 | Lam et al. | |
| 5,571,735 A | 11/1996 | Mogami et al. | |
| 5,576,988 A | 11/1996 | Kuo et al. | |
| 5,580,804 A | 12/1996 | Joh | 438/231 |
| 5,585,658 A | 12/1996 | Mukai et al. | 257/344 |
| 5,611,940 A | 3/1997 | Zettler | |
| 5,635,749 A | 6/1997 | Hong | 257/402 |
| 5,638,946 A | 6/1997 | Zavracky | |
| 5,650,340 A | 7/1997 | Burr et al. | 438/286 |
| 5,675,172 A | 10/1997 | Miyamoto et al. | 257/402 |
| 5,677,557 A | 10/1997 | Wuu et al. | |
| 5,679,595 A | 10/1997 | Chen et al. | |
| 5,702,972 A | 12/1997 | Tsai et al. | 438/305 |
| 5,719,422 A | 2/1998 | Burr et al. | |
| 5,719,430 A | 2/1998 | Goto | |
| 5,721,150 A | 2/1998 | Pasch | |
| 5,744,372 A | 4/1998 | Bulucea | 438/231 |
| 5,763,916 A | 6/1998 | Gonzalez et al. | 257/345 |
| 5,783,375 A | 7/1998 | Twist | |
| 5,783,846 A | 7/1998 | Baukus et al. | |
| 5,789,298 A | 8/1998 | Gardner et al. | 438/286 |
| 5,811,340 A | 9/1998 | Park | 438/291 |
| 5,821,147 A | 10/1998 | Kizilyalli | 438/305 |
| 5,821,590 A | 10/1998 | Lee et al. | 257/377 |
| 5,831,306 A | 11/1998 | Gardner et al. | 257/344 |
| 5,834,356 A | 11/1998 | Bothra et al. | |
| 5,834,809 A | 11/1998 | Kato et al. | 257/335 |
| 5,838,047 A | 11/1998 | Yamauchi et al. | |
| 5,854,510 A | 12/1998 | Sur, Jr. et al. | |
| 5,858,843 A | 1/1999 | Doyle et al. | |
| 5,866,933 A | 2/1999 | Baukus et al. | |
| 5,874,328 A | 2/1999 | Liu et al. | |
| 5,877,050 A | 3/1999 | Gardner et al. | 438/231 |
| 5,880,503 A | 3/1999 | Matsumoto et al. | |
| 5,888,887 A | 3/1999 | Li et al. | |
| 5,891,782 A | 4/1999 | Hsu et al. | 438/302 |
| 5,895,241 A | 4/1999 | Lu et al. | |
| 5,909,622 A | 6/1999 | Kadosh et al. | 438/286 |
| 5,920,097 A | 7/1999 | Horne | |
| 5,925,914 A | 7/1999 | Jiang | 257/344 |
| 5,930,663 A | 7/1999 | Baukus et al. | |
| 5,930,667 A | 7/1999 | Oda | |
| 5,933,737 A | 8/1999 | Goto | 438/291 |
| 5,960,291 A | 9/1999 | Krivokapic | 438/286 |
| 5,973,375 A | 10/1999 | Baukus et al. | |
| 5,977,593 A | 11/1999 | Hara | |
| 5,998,257 A | 12/1999 | Lane et al. | |
| 5,998,272 A | 12/1999 | Ishida et al. | 438/305 |
| 6,010,929 A | 1/2000 | Chapman | 438/226 |
| 6,020,227 A | 2/2000 | Bulucea | 438/194 |
| 6,030,869 A | 2/2000 | Odake et al. | 438/266 |
| 6,031,272 A | 2/2000 | Hiroki et al. | 257/404 |
| 6,037,627 A | 3/2000 | Kitamura et al. | |
| 6,044,011 A | 3/2000 | Marr | 375/154 |
| 6,046,659 A | 4/2000 | Loo et al. | |
| 6,054,659 A | 4/2000 | Lee et al. | |
| 6,057,520 A | 5/2000 | Goodwin-Johansson | |
| 6,064,110 A | 5/2000 | Baukus et al. | |
| 6,078,080 A | 6/2000 | Kadosh et al. | 257/344 |
| 6,080,614 A | 6/2000 | Neilson et al. | |
| 6,084,248 A | 7/2000 | Inoue | 257/66 |
| 6,090,692 A | 7/2000 | Song | 438/592 |
| 6,093,609 A | 7/2000 | Chuang | |
| 6,103,563 A | 8/2000 | Lukanc et al. | 438/231 |
| 6,117,762 A | 9/2000 | Baukus et al. | |
| 6,137,318 A | 10/2000 | Takaaki | |
| 6,146,952 A | 11/2000 | Nariman et al. | 438/286 |
| 6,153,484 A | 11/2000 | Donaton | |
| 6,154,388 A | 11/2000 | Oh | |

| | | |
|---|---|---|
| 6,215,158 B1 | 4/2001 | Choi |
| 6,242,329 B1 | 6/2001 | Huster et al. ............... 438/531 |
| 6,255,174 B1 | 7/2001 | Yu ............................... 438/286 |
| 6,261,912 B1 | 7/2001 | Hsiao et al. |
| 6,294,816 B1 | 9/2001 | Baukus et al. |
| 6,316,303 B1 | 11/2001 | Lin et al. .................... 438/222 |
| 6,326,675 B1 | 12/2001 | Scott et al. |
| 6,337,249 B1 | 1/2002 | Yamane et al. ............. 438/279 |
| 6,365,453 B1 | 4/2002 | Deboer et al. |
| 6,373,106 B2 | 4/2002 | Maki et al. ................... 257/369 |
| 6,380,041 B1 | 4/2002 | Yeap et al. ................... 438/302 |
| 6,384,457 B2 | 5/2002 | Tyagi et al. ................. 257/408 |
| 6,399,452 B1 | 6/2002 | Krishnan et al. ............ 438/305 |
| 6,410,413 B2 | 6/2002 | Scott et al. .................. 438/601 |
| 6,455,388 B1 | 9/2002 | Lai et al. ..................... 438/303 |
| 6,465,315 B1 | 10/2002 | Yu ................................ |
| 6,466,489 B1 | 10/2002 | Ieong et al. ............. 365/189.09 |
| 6,476,449 B1 | 11/2002 | Lin ............................... 257/360 |
| 6,479,350 B1 | 11/2002 | Ling et al. ................... 438/265 |
| 6,503,787 B1 | 1/2003 | Choi |
| 6,534,787 B1 | 3/2003 | Hsu ............................... 257/66 |
| 6,566,204 B1 | 5/2003 | Wang et al. .................. 438/286 |
| 6,613,661 B1 * | 9/2003 | Baukus et al. ............... 438/598 |
| 6,653,694 B1 | 11/2003 | Osanai ......................... 257/392 |
| 6,740,942 B2 | 5/2004 | Baukus et al. |
| 6,746,924 B1 | 6/2004 | Lee et al. ..................... 438/286 |
| 6,815,816 B1 | 11/2004 | Clark, Jr. et al. ............. 257/734 |
| 6,825,530 B1 | 11/2004 | Brown et al. ................ 257/337 |
| 6,833,307 B1 | 12/2004 | Wristers et al. ............... 438/302 |
| 6,833,589 B2 | 12/2004 | Matsuhashi et al. ......... 257/404 |
| 6,911,694 B2 | 6/2005 | Negoro et al. ................ 257/336 |
| 6,919,600 B2 | 7/2005 | Baukus ......................... 257/341 |
| 6,921,690 B2 | 7/2005 | Church ......................... 438/241 |
| 6,930,361 B2 | 8/2005 | Inaba ........................... 257/408 |
| 6,933,560 B2 | 8/2005 | Lee et al. ..................... 257/328 |
| 7,012,273 B2 | 3/2006 | Chen ............................... 257/4 |
| 7,091,114 B2 | 8/2006 | Ito ................................. 438/527 |
| 7,179,712 B2 | 2/2007 | Hoefler ........................ 438/278 |
| 7,195,266 B2 | 3/2007 | Ricke et al. .................. 280/280 |
| 7,208,383 B1 | 4/2007 | Weintraub et al. ........... 438/302 |
| 7,242,063 B1 | 7/2007 | Chow et al. ................... 257/369 |
| 7,344,932 B2 | 3/2008 | Chow ........................... 438/298 |
| 2001/0042892 A1 | 11/2001 | Okada et al. ................ 257/382 |
| 2002/0043689 A1 | 4/2002 | Matsuoka et al. ........... 257/368 |
| 2002/0058368 A1 | 5/2002 | Tseng |
| 2002/0096776 A1 | 7/2002 | Chow ........................... 257/774 |
| 2002/0173131 A1 | 11/2002 | Clark, Jr. et al. |
| 2002/0190355 A1 | 12/2002 | Baukus et al. |
| 2003/0057476 A1 | 3/2003 | Morita et al. |
| 2003/0127709 A1 | 7/2003 | Lippmann ................... 257/758 |
| 2003/0173622 A1 | 9/2003 | Porter et al. ................. 257/355 |
| 2003/0205816 A1 | 11/2003 | Janke ........................... 257/758 |
| 2004/0051137 A1 | 3/2004 | Kitamura ..................... 257/344 |
| 2004/0061186 A1 * | 4/2004 | Chow et al. ................. 257/399 |
| 2004/0075147 A1 | 4/2004 | Ueda et al. ................... 257/368 |
| 2004/0099912 A1 | 5/2004 | Chow et al. .................. 257/368 |
| 2004/0144998 A1 | 7/2004 | Chow et al. ................. 257/213 |
| 2004/0164361 A1 | 8/2004 | Baukus et al. ............... 257/402 |
| 2004/0211990 A1 | 10/2004 | Asano .......................... 257/279 |
| 2005/0082625 A1 | 4/2005 | Kim ............................. 257/412 |
| 2005/0230787 A1 | 10/2005 | Chow et al. .................. 257/629 |
| 2006/0049449 A1 | 3/2006 | Iino ............................. 257/315 |
| 2006/0071278 A1 | 4/2006 | Takao ........................... 257/365 |
| 2006/0105489 A1 | 5/2006 | Rhodes .......................... 438/48 |
| 2006/0157803 A1 | 7/2006 | Chow ........................... 257/399 |

FOREIGN PATENT DOCUMENTS

| | | |
|---|---|---|
| EP | 0 364 769 | 4/1990 |
| EP | 0 463 373 | 1/1992 |
| EP | 0 528 302 | 2/1993 |
| EP | 0 585 601 | 3/1994 |
| EP | 0 764 985 | 3/1997 |
| EP | 0 883 184 | 12/1998 |
| EP | 0 920 057 | 6/1999 |
| EP | 1 193 758 | 4/2002 |
| EP | 1 202 353 | 5/2002 |
| FR | 2 486 717 | 1/1982 |
| JP | S58-016565 | 7/1982 |
| JP | 58-190064 | 11/1983 |
| JP | S59-035465 | 2/1984 |
| JP | 61-147551 | 7/1986 |
| JP | 61-201472 | 9/1986 |
| JP | 63-129647 | 6/1988 |
| JP | H01-213350 | 8/1989 |
| JP | 02-046762 | 2/1990 |
| JP | H02-062118 | 3/1990 |
| JP | 02-188944 | 7/1990 |
| JP | 02-237038 | 9/1990 |
| JP | H02-237038 | 9/1990 |
| JP | 04-028092 | 1/1992 |
| JP | H04-267553 | 9/1992 |
| JP | H05-218849 | 8/1993 |
| JP | H08-274041 | 10/1996 |
| JP | 10-256398 | 9/1998 |
| JP | 2000-040809 | 2/2000 |
| JP | 2000-040810 | 2/2000 |
| WO | 98/21734 | 5/1998 |
| WO | 98/57373 | 12/1998 |
| WO | 00-44012 | 7/2000 |
| WO | 0055889 | 9/2000 |

OTHER PUBLICATIONS

Frederiksen, T.M., "Standard Circuits in the New CMOS Era," Initiative CMOS Electronics revised edition, pp. 134-146 (Jan. 1989).

Hodges, et al., Analysis and Design of Digital Integrated Circuits, 2nd edition, McGraw-Hill, p. 353 (1988).

IBM. Sub.—TDB, "Static Ram Double Polysilicon Dynamic Memory Cell with Polysilicon Bit Line," vol. 21, Issue No. 9, pp. 3828-3831 (Feb. 1979).

IBM. Sub.—TDB, "Static Ram Double Polysilicon Process," vol. 23, Issue No. 8, pp. 3683-3686 (Jan. 1981).

Larson, L.E., et al., "Microactuators for GaAs-based Microwave Integrated Circuiits," IEEE, pp. 743-746 (1991).

Lee, "Engineering a Device for Electron-Beam Probing,"IEEE Design and Test of Computers, pp. 36-49 (Jun. 1989).

Ng, K.K., Complete Guide to Semiconductor Devices, McGraw-Hill, pp. 164-165 (1995).

Sze, S.M, VLSI Technology, McGraw-Hill, pp. 99,447,461-465 (1983).

Sze, S.M., ed., "Silicides for Gates and Interconnections," VLSI Technology, McGraw-Hill, pp. 372-380 (1983).

U.S. Appl. No. 09/391,258, filed Sep. 7, 1999, Baukus.

U.S. Appl. No. 09/758,792, filed Jan. 11, 2001, Baukus.

U.S. Appl. No. 10/828,022, filed Apr. 19, 2004, Chow et al.

VLSI manufacturing process, pp. 172 and 279, published 1997 in Taiwan (untranslated).

Office action dated May 28, 2002 from Taiwanese Patent No. 201664 with its English translation.

Office action mailed on Feb. 8, 2011 for Japanese Patent Application No. 2000-614502 and its English translation.

* cited by examiner

PROGRAMMABLE CONNECTION AND ISOLATION OF ACTIVE REGIONS IN AN INTEGRATED CIRCUIT USING AMBIGUOUS FEATURES TO CONFUSE A REVERSE ENGINEER

CROSS REFERENCE TO RELATED APPLICATIONS

This application is related to co-pending U.S. patent application Ser. No. 09/758,792 entitled "Circuit Protection Implemented Using a Double Polysilicon Layer CMOS Process" filed on Jan. 11, 2001 by J. P. Baukus, Lap Wai Chow and W. C. Clark.

This application is also related to U.S. patent application Ser. No. 10/637,848 entitled "Use of Silicon Block Process Step to Camouflage a False Transistor" filed on Aug. 7, 2003 by Lap Wai Chow, W. C. Clark, J. P. Baukus and G. Harbison (Now U.S. Pat. No. 6,979,606 issued Dec. 27, 2005), the disclosure of which is hereby incorporated herein by reference.

TECHNICAL FIELD

The present invention relates to integrated circuits (ICs) and semiconductor devices in general and their methods of manufacture wherein the integrated circuits and semiconductor devices employ camouflaging techniques which make it difficult for the reverse engineer to discern how the semiconductor device functions.

RELATED ART

The present invention is related to the following US patents by some of the same inventors as the present inventors:
(1) U.S. Pat. Nos. 5,866,933; 5,783,375 and 6,294,816 teach connecting transistors in a CMOS circuit by implanted (and therefore hidden and buried) lines between the transistors. The implanted lines are formed by modifying the p+ and n+ source/drain masks. These implanted interconnections are used to make 3-input AND or OR circuits look substantially identical to the reverse engineer. Also, buried interconnects force the reverse engineer to examine the IC in greater depth to try to figure out the connectivity between transistors and hence their function.
(2) U.S. Pat. Nos. 5,783,846; 5,930,663 and 6,064,110 teach modifying the source/drain implant masks to provide a gap in the implanted connecting lines between transistors. The length of the gap being approximately the minimum feature size of the CMOS technology being used. If this gap is "filled" with one kind of implant, the line conducts; but if it is "filled" with another kind of implant, the line does not conduct. The intentional gaps are called "channel blocks." The reverse engineer is forced to determine connectivity on the basis of resolving the implant type at the minimum feature size of the CMOS process being used.
(3) U.S. Pat. No. 6,117,762 teaches a method and an apparatus for protecting semiconductor integrated circuits from reverse engineering. Semiconductor active areas are formed on a substrate and a silicide layer is formed over at least one active area of the semiconductor active areas and over a selected substrate area. The silicide layer connecting the at least one active area with another active area.

BACKGROUND OF THE INVENTION

The creation of complex integrated circuits and semiconductor devices can be an expensive undertaking because of the large number of hours of sophisticated engineering talent involved in designing such devices. Additionally, integrated circuits can include read only memories and/or EEPROMs into which software, in the form of firmware, is encoded. Further, integrated circuits are often used in applications involving the encryption of information. In order to keep the encrypted information confidential, devices should be protected from being reverse engineered. Thus, there can be a variety of reasons for protecting integrated circuits and other semiconductor devices from being reversed engineered.

In order to keep the reverse engineer at bay, different techniques are known in the art to make integrated circuits more difficult to reverse engineer. One technique is to make the connections between transistors difficult to determine forcing the reverse engineer to perform a careful analysis of each transistor (in particular, each CMOS transistor pair for CMOS devices), and thwarting attempts to use automatic circuit and pattern recognition techniques in order to reverse engineer an integrated circuit. Since integrated circuits can have hundreds of thousands or even millions of transistors, forcing the reverse engineer to analyze each transistor carefully in a device can effectively frustrate the reverse engineer's ability to reverse engineer the device successfully.

A conductive layer, such as silicide, is often used during the manufacture of semiconductor devices. In modern CMOS processing, especially with a minimum feature size below 0.5 µm, a silicide layer is utilized to improve the conductivity of gate, source and drain contacts. In accordance with typical design rules, any active region resulting in a source/drain region is often silicided.

One reverse engineering technique involves de-layering the completed IC by means of chemical mechanical polishing (CMP) or other etching processes. The etching processes may, under some conditions, reveal the regions between where the silicide was formed on the substrate, and where it was not, i.e. the regions defined by the silicide block mask step and by regions where structures, such as a polysilicon gate, prevent the silicide layer from being deposited on the substrate. These regions may be revealed because, under some kinds of etches, there is an observable difference in topology due to different etching rates for silicided versus non-silicided silicon. The reverse engineer, by noting the silicided areas versus non-silicided areas, may make assumptions as to the function of the device. This information can then be stored into a database for automatic classification of other similar devices.

Some methods of protecting against reverse engineering may be susceptible to discovery under some reverse engineering techniques, such as chemical-mechanical polishing (CMP) or other etching techniques. For example, FIG. 1a depicts a possible top-down view of a false transistor FT made in accordance with U.S. patent application Ser. No. 09/758, 792 after etching. During the manufacturing of the false transistor, and in accordance with normal design rules, the silicide block mask allows for a silicide layer 15, see FIG. 1b, to be placed completely over the active regions 12, 16 in substrate 22, and optionally over gate layer 14. Gate layer 14 may be a polysilicon layer. During the CMP reverse engineering process, the gate layer 14 would be removed, thereby resulting in the top-down view as shown in FIG. 1a. As shown, the silicide layer edge 18 aligns with the gate edge 11, 13, thus the reverse engineer only sees one line along the gate edge 11, 13.

The top-down view of the false transistor is different from a top-down view of a true transistor and as such, the difference may be a signature that the transistor is not a true transistor.

For functional or true transistors, as shown in FIGS. 2a and 2b, the silicide layer edge 18' is offset from the polysilicon gate layer 14 due to the presence of sidewall spacers 19 that are formed adjacent to gate layer 14. A lightly doped density (LDD) implant 10 is typically formed after the formation of the gate layer 14 and before the formation of the sidewall spacers. After sidewall spacers 19 are formed, active areas 12, 16 are typically formed in the substrate. The formation of active areas 12, 16 saturate most of the LDD implant, so that only the portion of the LDD implant 10 that is under the sidewall spacers 19 effectively remains. A conductive layer, such as silicide 15, is typically placed over the active areas 12, 16 and over the gate layer 14. The sidewall spacers 19 prevent the silicide from being deposited upon the exposed substrate in those areas. Thus, the artifact edge 18' is spaced from and lies mostly parallel with the edges 11, 13 of the gate layer 14 for a true transistor TT. Thus, from the examination of the top-down views of FIGS. 1a and 2a the reverse engineer may be able to determine that a structure originally placed in the area was in fact a (i) false transistor FT meant to confuse the reverse engineer due to the absence of artifact edges 18' lying spaced from and mostly parallel with edges 11, 13 of the polysilicon gate 14 or (ii) a true transistor TT. A reverse engineer could then program computer software to recognize the absence of artifact edges 18' of the silicide layers lying separate from and being mostly parallel with the edges 11, 13 of the gate layer 14 as indications of false transistors FT among a plurality of true transistors TT formed on a single integrated circuit device or chip.

It should be understood that although FIG. 1b depicts active regions 12, 16 adjacent to the gate layer 14 and FIG. 2b depicts LDD implants 10 adjacent to the gate layer 14, it is extremely difficult, if not impossible, for the reverse engineer to determine a difference in both doping levels and doping types (n or p) between the LDD implant 10 and the active regions 12, 16.

Our U.S. patent application Ser. No. 10/637,848 teaches a semiconductor device and a method of manufacturing semiconductor devices that uses artifact edges to confuse the reverse engineer. Providing artifact edges that are not indicative of the actual device formed will further confuse the reverse engineer and result in incorrect conclusions as to the actual composition, and thus function, of the device.

We have further developed the teachings about in order to allow LDD implants and, preferably in combination with judicious patterning of silicide layers, to interconnect (or not interconnect) active regions of different transistors in a way which is very apt to confuse the reverse engineer. This new technique can be used with the techniques disclosed in the related application to further confuse the reverse engineer.

SUMMARY OF THE INVENTION

A technique is described by which connections between transistors (and more specifically between implanted active areas from which transistors are formed) in a CMOS logic circuit are produced in such a way that they are difficult to observe by a reverse engineer. In fact, the structure by which the connection is affected is a lightly doped density (LDD) implanted region between the active areas and the difficulty for the reverse engineer comes from two aspects of this invention and the structure described below. First, connections or disconnections can be made by the same structure by choosing either the "right" LDD implant or the "wrong" LDD implant depending upon the dopant type (n or p) used for the active areas. Because the dopant density of the LDD is so small, the reverse engineer cannot use typical reverse engineering techniques to determine when implants are in the substrate and what their polarity is. Second, the connections are not made via metal wiring above the substrate that is clearly visible to the reverse engineer, as a result etching to the surface is required. Because of the relatively small density of the LDD implant compared to the implant used in a normal source or drain active region, the connections made are more resistive than would be a by conductive metal wiring or by a heavier implant. As a result, the technique would preferentially be used to connect transistors that do not carry signal power, but rather are necessary for the logical performance of the circuit. There are many such connections in a typical IC and hence, using this invention, all or some of these "connections" can be made that they appear functionally ambiguous to the reverse engineer.

In another aspect the present invention provide methods for and structures for camouflaging an integrated circuit structure and strengthen its resistance to reverse engineering. A plurality of transistors are formed in a semiconductor substrate, at least some of the transistors being of the type having sidewall spacers with LDD regions formed under the sidewall spacers. Transistors are programmably interconnected with ambiguous interconnection features, the ambiguous interconnection features each comprising a channel formed in the semiconductor substrate with preferably the same dopant density as the LDD regions, with selected ones of the channels being formed of a conductivity type supporting electrical communication between interconnected active regions and with other selected ones of the channels being formed of a conductivity type inhibiting electrical communication but ambiguously appearing to a reverse engineer as supporting electrical communication.

BRIEF DESCRIPTION OF THE DRAWINGS

FIG. 1b depicts a cross-section view of the false transistor of FIG. 1a;

FIG. 2b depicts a cross-section view of the prior art true transistor of FIG. 2a;

DETAILED DESCRIPTION

The present invention now will be described more fully hereinafter with reference to the accompanying drawings, in which a two embodiments of the invention are shown. This invention may be embodied in many different forms and should not be construed as limited to the embodiments set forth herein.

Many methods of manufacturing semiconductor devices are well known in the art. The following discussion focuses on modifying a conductive layer block mask used during the manufacture of semiconductor devices in order to confuse the reverse engineer. The discussion is not intended to provide all of the semiconductor manufacturing details, which are well known in the art. Moreover, the following detailed description discusses the formation of implanted regions in a semiconductor substrate. Those skilled in the art will appreciate that regions in a semiconductor substrate formed by adding dopants into the substrate can be formed by a number of techniques, including implantation and diffusion. In terms of the present disclosure, implantation is the preferred technique, but those skilled in the art should realize that other regions forming techniques may alternatively be used if desired.

Figure 1A:
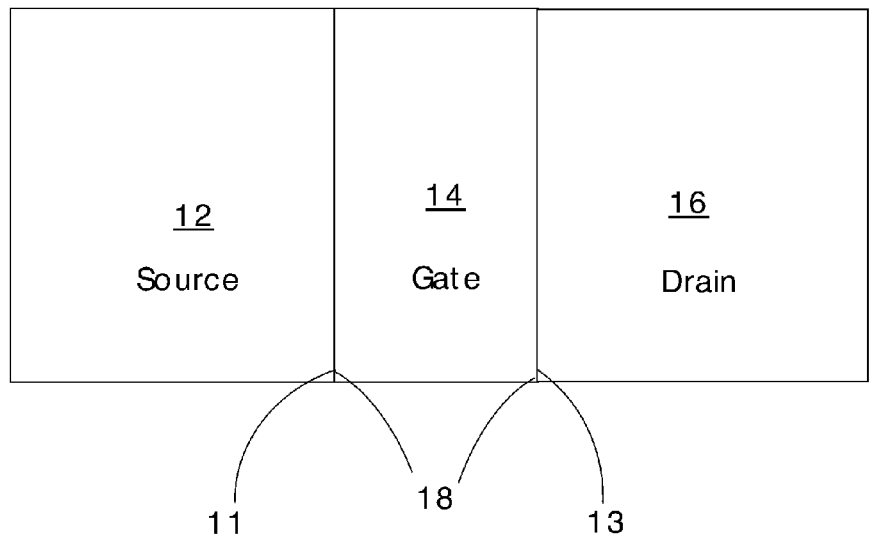
FIG. 1a depicts artifact edges of a silicide layer that the reverse engineer could see after all the metal and oxide layers have been removed from a false transistor.
Figure 1B:
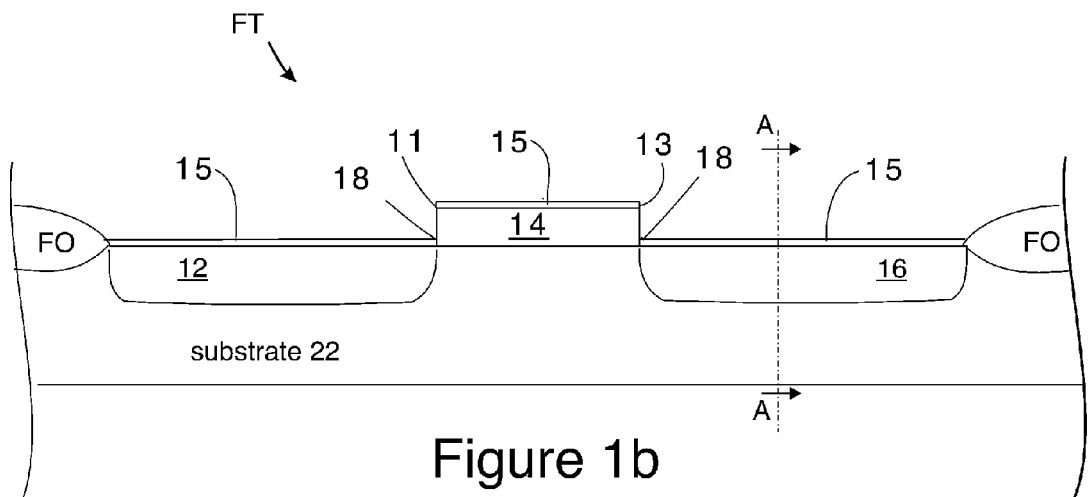
Figure 2A:
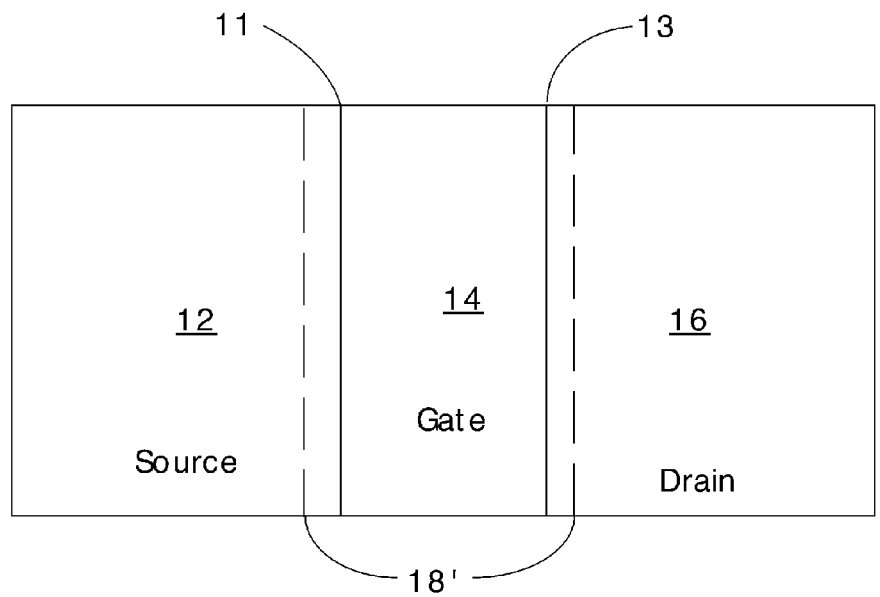
FIG. 2a depicts prior art artifact edges of a silicide layer that the reverse engineer could see after all the metal and oxide layers have been removed from a true transistor.
Figure 2B:
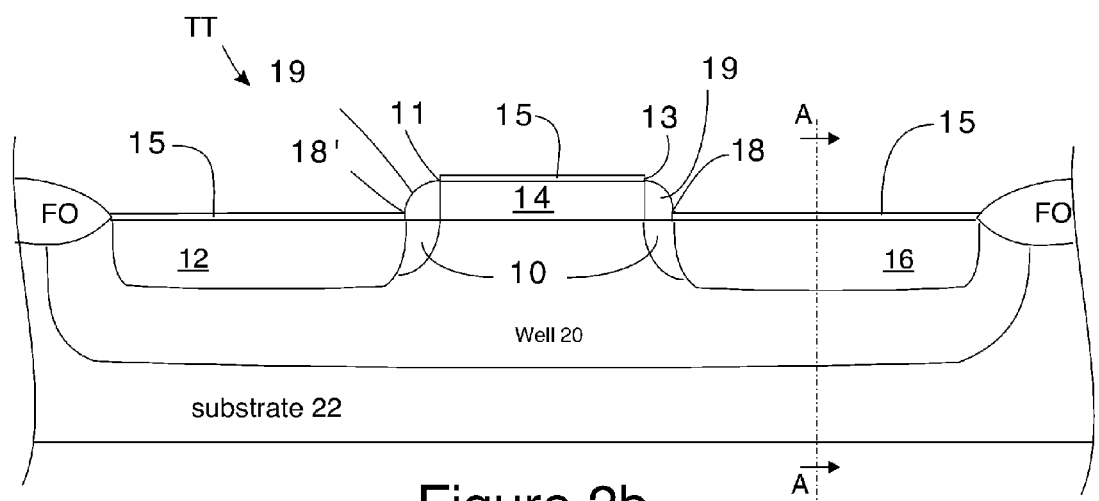

In order to confuse the reverse engineer, the placement of an artifact edge of a silicide layer that would be seen when a reverse engineer examines devices manufactured with other reverse-engineering-detection-prevention techniques can be changed, as described in the patent application referred to above. In reverse-engineering-detection-prevention techniques, false, or non-operational, transistors may be used along with true, or operational, transistors. Some false transistors are manufactured without sidewall spacers, see FIG. 1b, while corresponding true transistors may well have sidewall spacers 19, as shown in FIG. 2b. Depending of the conductivity type of device's implanted source and drain, a well 20 may be formed as is well known in the art. The doped regions 10 under the side wall spacers 19 are referred to as Lightly Doped Density (LDD) regions since the level of doping is considerable lighter compared to the level of doping in source and drain regions 12, 16. From a top-down view, and when most reverse engineering techniques are used, these false transistors look the same as operational transistors. However, using some reverse engineering techniques, such as chemical mechanical polishing (CMP) or other etching processes, the artifact edges of the silicide layer may be exposed and thereby give away the reverse-engineering-detection-prevention technique being utilized (that this, the reverse engineer discovers how to detect the presence of false transistors). As shown in FIG. 1a, for some false transistors, the artifact edges 18 of a silicide layer 15 coincide with the edges 11, 13 of the gate layer 14. However, with operational transistors as shown in FIG. 2a, the artifact edges 18' of a silicide layer 15 are offset from the edges 11, 13 of the gate layer 14 by the width of sidewall spacers 19.

Techniques for locating the artifact edges on non-operational transistors such that they appear to a reverse engineer as operational transistors are discussed in our co-pending pending U.S. patent application Ser. No. 10/637,848 discussed above.

Figure 3:
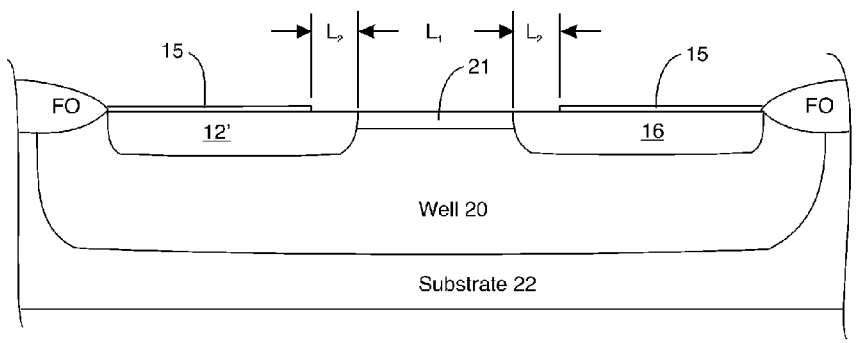
FIG. 3 depicts a structure to provide programmable connection or isolation between two spaced apart active areas, denoted by the active regions on this figure.
Figure 3A:
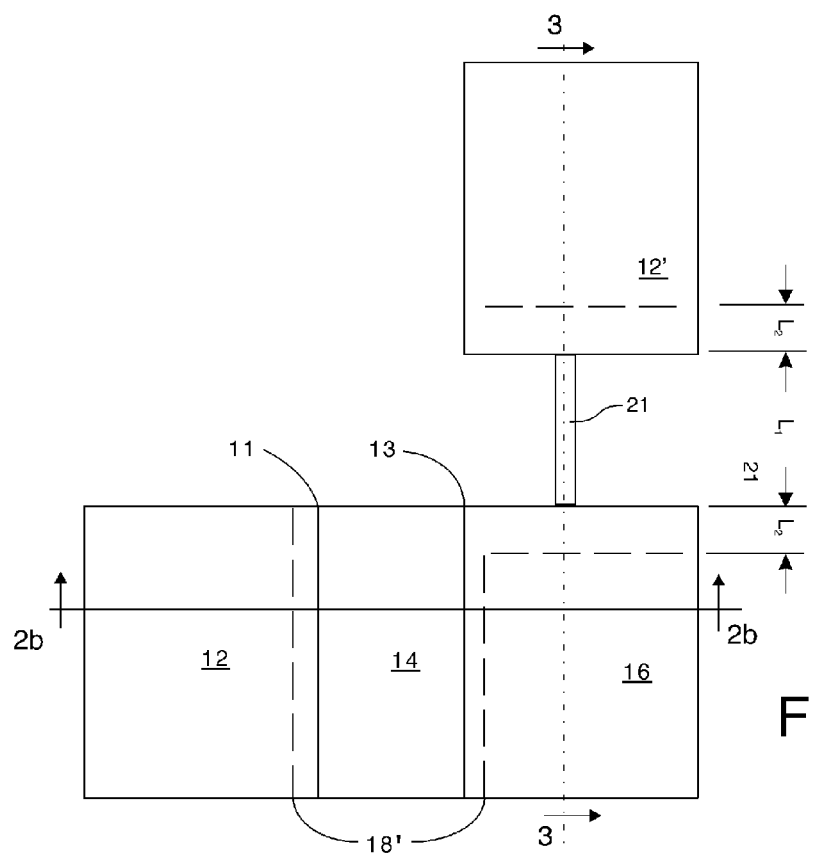
FIG. 3a is a plan view showing the relationship between the section view of FIG. 2 and the section view of FIG. 3.

The presently disclosed technique also allows for connections between transistors (and more specifically between implanted active areas from which transistors are formed) in a CMOS logic circuit to be formed in such a way that they are difficult to observe by a reverse engineer. In FIGS. 3, 3a, 5a and 5b, two active regions 12' and 16 are depicted. Each active region 12', 16 is associated with a different transistor device. It is assumed here that active region 16 corresponds to either an active region of a functional or a non-functional transistor device, such as, for example, the transistors shown in Figures 1b and 2b. FIG. 3 corresponds to a section view taken along line A-A in FIGS. 1b or 2b. The other active region 12' is an active region of a second transistor device, either operational (and hence a true transistor) or non-operational (and hence a false transistor). Each transistor has its own gate region, shown in FIGS. 1b (if a false transistor is utilized) or FIG. 2b (if a true transistor is utilized). The gate regions can be oriented above and/or below the major surface of the substrate shown in the section view of FIG. 3 or the gate regions could be arranged outboard of the active regions which the location where field oxide (FO) is presently shown, if desired. Persons skilled in the art should be able to appropriately position gate regions next to the depicted active regions 12, 16, either as shown or as described.

The structure by which the connection is effected between the two active regions is a lightly doped density (LDD) region or channel 21 disposed between the active regions 12', 16. Channel 21 is preferably formed using semiconductor implantation techniques, but other well-known semiconductor fabrication techniques, known to those skilled in the art may be used instead to form regions or channel 21 and indeed to form active regions 12', 16 as well.

The lightly doped density (LDD) region or channel 21 is preferably formed at the same time and with the same dopant concentration and depth as LDD region 10, which is also preferably formed by the same fabrication technique used to form region or channel 21, such as implantation, but its polarity will depend on whether it is formed at the same time as the LDD regions 10 of a (i) n-type or (ii) p-type transistor. As such, no additional processing should be needed to be added to conventional CMOS processing in order to implement this technology since the LDD regions 10 of both (i) n-type and (ii) p-type transistors are formed when making CMOS devices. Therefore the polarity of the region or channel 21 can be programmed as desired by selecting whether region or channel 21 has n-type or p-type doping.

The difficulty for the reverse engineer comes from two aspects of this invention and this structure. First, connections or disconnections can be made by the same structure 21 by choosing either the "right" LDD implant conductivity type or the "wrong" LDD implant conductivity type depending upon the dopant type (n or p) used for the connected active areas. For example, if active regions 12' and 16 are n-type, then a n-type LDD channel 21 interconnecting them will form an electrical conduction path between regions 12' and 16, whereas if active regions 12' and 16 are again n-type but region 21 is formed using a dopant creating p-type conductivity, then no electrical conduction channel is then formed between regions 12' and 16. The dopant density of the LDD is sufficiently small compared to the doses normally used in the source and/or drain active regions, that the reverse engineer cannot easily use his or her conventional reverse engineering techniques to determine both (i) where LDD regions and/or channels 21 occur in the substrate and (ii) what their conductivity type is. Since channel 21 is formed when other LDD regions 10 are formed, it has the same relatively low dopant density and the reverse engineer will have some difficulty in determining whether channel 21 even exists and even more difficulty in determining whether it is conducting or non-conducting. Second, the connections between regions 12' and 16 are not made via a conventional metal layer above the substrate (that is clearly visible to the reverse engineer), and therefore etching of the surface is required by the reverse engineer to "see" connections formed by channels 21. Since the channels 21 preferably have LDD doping levels they are hard to even see using etching techniques. And since the channels 21 preferably have LDD doping levels their polarity (n-type or p-type) is even more difficult to determine. And if the reverse engineer has to find thousands of channels 21 on a given chip and then try to determine their polarities, then he or she was a major, time-consuming problem to solve.

Because of the preferred relatively small concentration of the LDD impurity dosage (used to make the LDD region n-type or p-type) compared to the impurity dosage used in a typical source or drain active region, the connections 21 made (when they are of the same conductivity type as the active regions they are joining) are more resistive than would be by conductive metal wiring or by a heavier dopant concentration. As a result, this technique is preferably be used to connect active areas of transistors that do not carry signal power (like a RF power transistor, for example), but rather are preferably used to interconnect low power transistors used, for example, in the logical operation of an intended circuit. There are many such low power connections in a typical IC and hence, using this invention, all or some of these "connections" can be made that they appear functionally ambiguous to the reverse engineer.

The designer who utilizes region or channel 21 has the following options:

(i) to make a connection between two N+ regions 12', 16, the implant 21 would be a n-type LDD implant;

(ii) to instead isolate the two N+ regions 12', 16, the one could provide no channel 21 and instead rely on the p-well 20 or provide a p-type LDD dose to channel 21, depending on the details of the process and the implant levels available.

The design constraints for $L_1$ and $L_2$ are as follows:

(i) $L_1$, the distance between the active regions of neighboring transistors (see FIG. 3), should preferably be as small as reasonably possible (in order to reduce the resistance of the channel 21), the value of $L_1$ typically being specified by the design rules for the CMOS fabrication process being used.

(ii) $L_2$ is the minimum silicide block overlap S/D implant (i.e. the implants 12', 16 in this figure) to ensure there is no short from the silicide 15 to either the channel 21, the substrate 22 or the well 20, as the case may be, due to mask alignment errors.

If the channel 21 is intended as being a false, non-conducting channel, then allowing silicide overlay it (at the points where it meets the active regions 12', 16) would bring channel 21 into conduction when it is desired that it be non-conducting. If the channel 21 is supposed to be conducting, then allowing the silicide to overlay does not adversely affect its conductivity, but since the desire is to confuse the reverse engineer, the silicide is preferably spaced from the channels 21 (for both conducting and non-conducting channels) at least one end of the channel so that both conducting and non-conducting channels 21 would be conducting or non-conducting as a function of the conductivity type of the channel 21 as opposed to the configuration of the overlying silicide layer (since the configuration of the overlying silicide layer is more easily detected by the reverse engineer than is the existence and conductivity type—polarity—of the channels 21.

The distance $L_2$ is usually larger than a typical sidewall spacing thickness.

The discussion above regarding FIG. 3 is with reference to a n-type structure with a p-type well 20. A p-type structure would use dopings of the opposite conductivity type (n-type for the source and drain and their associate LDD regions, if used), but otherwise the same structural arrangements would apply. The use of well 20 in substrate 22 may be optional as is well known in the art. Also, while the active regions 12', 16 and the well region 20 are preferably formed using implantation techniques, it is be understood that the present invention does not necessarily require the use of implantation techniques to form those regions or any of the regions and channels depicted as other techniques may be used to add dopant to semiconductor materials. Typically the substrate may be silicon, but the techniques disclosed herein are not limited to silicon based semiconductor material technology.

Figure 4:
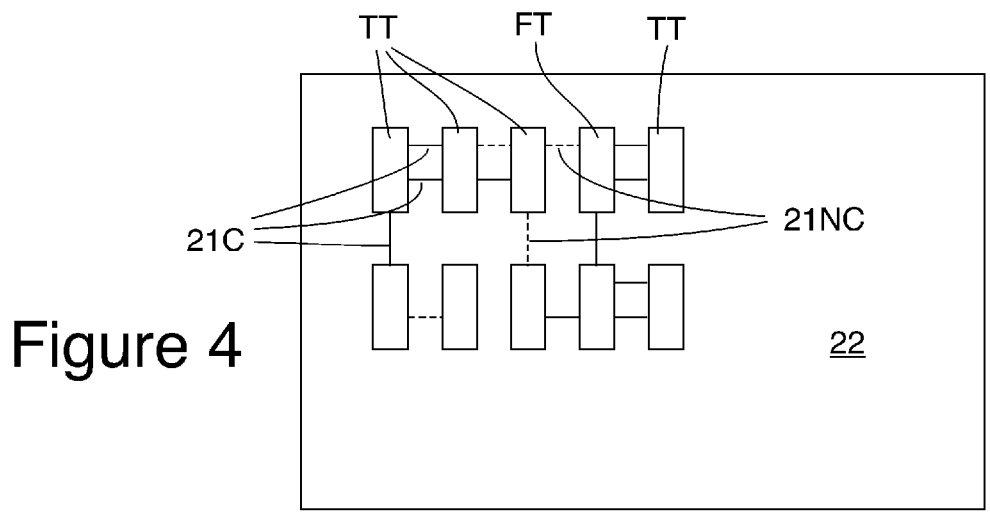
FIG. 4 is a plan view of a portion of a semiconductor chip diagrammatically showing a plurality of transistors formed thereon with programmable connection or isolation between the active regions thereof.

FIG. 4 depicts who this technology can be used in designing and/or making a semiconductor chip which is resistance to reverse engineering. FIG. 4 depicts a plurality of true transistors TT formed in or on substrate 22. The true transistors may form CMOS devices, that is, they may comprises both N-type true transistors and P-type true transistors. Optionally, false transistors FT may be formed on or in substrate 22 in order to try to confuse the reverse engineer as taught by U.S. patent application Ser. No. 09/758,792 mentioned above. The transistors (TT and also FT, if utilized) are interconnected to form an operational circuit. The interconnections are preferably formed by utilizing the afore-described channels 21 to connect nearby or adjacent active regions of the true transistors (and also with active regions of false transistors should they be used). The previously described, the channels 21 can be conducting or non-conducting. Conducting channels 21C and true transistors TT are used to help form the aforementioned operational circuit. Non-conducting channels 21NC (and false transistors FT, if utilized) are used to confuse the reverse engineer by making it appear to the reverse engineer that there exist additional functional conducting channels 21 (and possibly additional functional transistors) when those additional channels (and additional transistors, if used) are in fact non-conducting and thus do not adversely influence the proper operation of the circuit. Of course, if the reverse engineer cannot easily distinguish between a conducting channel 21C and a non-conducting channel 21NC, then the reverse engineer is presented with a daunting problem in figuring out how the circuit works, particularly if the chip has thousands or even millions of true transistors TT with many, many conducting channel connections 21. Then, you add some optional false transistors FT to the mix, and the result is a very confused reverse engineer.

In FIG. 4 only ten transistors are shown on a chip substrate 22 and they are shown connected in a purely arbitrary fashion with channels 21. The conducting channels 21C would preferably form an operational circuit. The non conducting channels 21NC would be present only to confuse the reverse engineer.

In order to make a circuit truly operational, chances are that many transistor interconnects will need to be provided and, due to topology limitations, some of the interconnects will be provided by conventional imaged metal layers. But the use of conventional imaged metal layers for transistor interconnects should preferably be minimized since it is a fairly easy task for the reverse engineer to work out such metal interconnects on a semiconductor chip. Let the reverse engineer toil away instead trying to figure out which channels 21 are conducting (and therefore real) and which channels 21 are non-conducting (and therefore fake), since they all look the same to the reverse engineer who sees the chip in a top down view.

The above-discussed embodiment demonstrates one technique for providing ambiguity in interconnects between active regions of spaced apart transistors. This technology can be used in other connection embodiments, such as a connection of an active region to either $V_{ss}$ or $V_{dd}$.

Figure 5A:
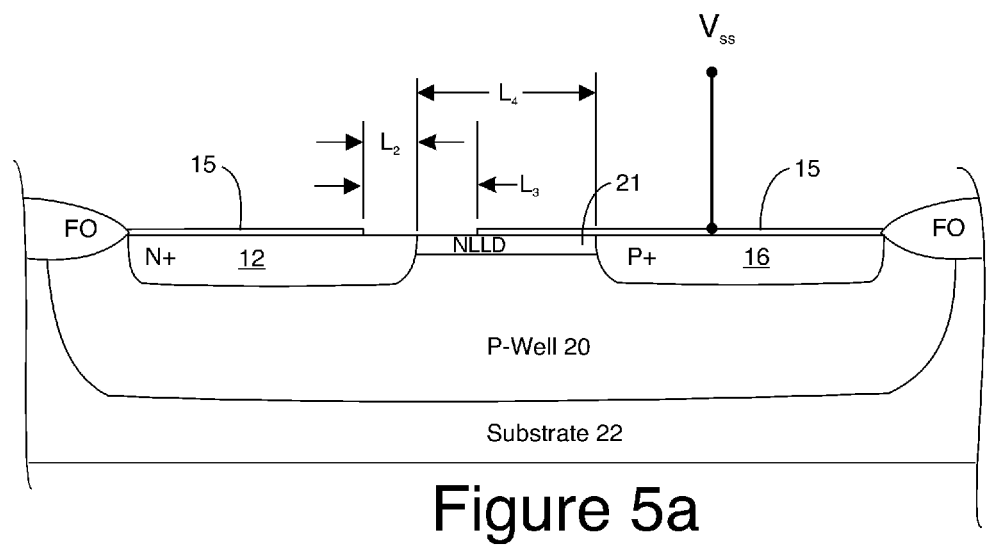
FIG. 5a depicts a structure to provide connection or isolation between an implanted active area of a transistor (the N+active region in this figure) and $V_{ss}$.
Figure 5B:
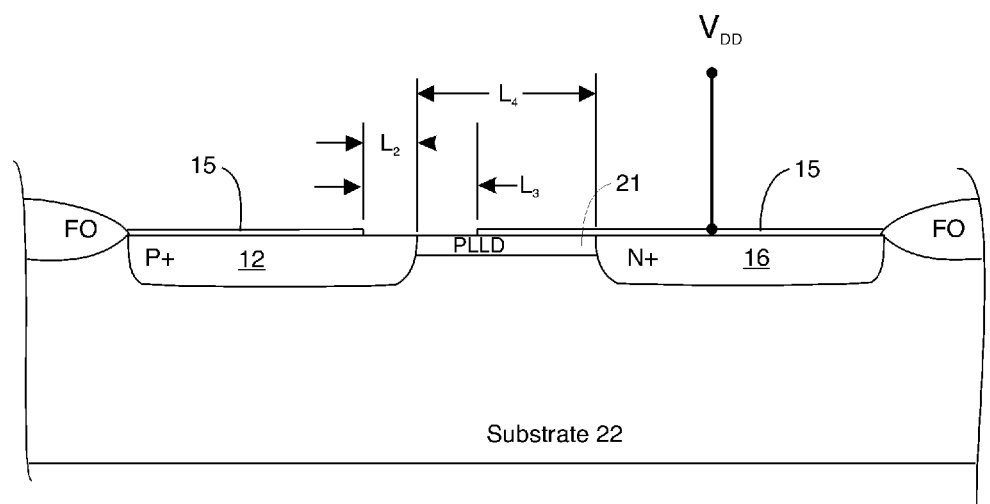
FIG. 5b is similar to the embodiment of FIG. 4a, but this embodiment depicts a structure to provide connection or isolation between an implanted active area of a transistor (the P+ active region in this figure) and $V_{dd}$.

The channels 21, as noted provide desirable ambiguity, and similar structures can be fabricated with ambiguity of connection or isolation to either $V_{ss}$ or $V_{dd}$, for example. See FIGS. 5a and 5b. The these figures the LDD doped region or channel 21:

(i) can be a N-type LDD (NLDD) doped channel to connect an active region 12 to $V_{ss}$ in a n-type structure as shown in FIG. 5a, or (ii) the opposite, i.e. a P-type LDD (PLDD) doped channel to isolate an active region 12 from $V_{DD}$ as shown in FIG. 5b.

The design rules for the fabrication process determine the dimensions noted below, i.e.

(i) $L_3$=the minimum silicide block opening which consists of one part within the active region that prevents leakage plus another part outside the active region where the distance is the possible mask alignment error for the process utilized;

(ii) $L_4$=the minimum N+ to P+ separation within the same region of active area—i.e. a breakdown consideration;

(iii) $L_2$=specifies the mask alignment error to insure that active region (which could be N+ type) is not shorted to the well (which would then be p-type).

As noted above, a reverse engineer uses an etch process to try to differentiate the polarity of doped areas, but, more accurately, the etch process helps determine an edge between two different doped regions. This difference may be either in concentration or polarity (e.g., a N+active region compared to a P-type well or other LDD regions). The difference will be seen due to the difference in the etch rate between the differently doped regions. Since the LDD implant is relatively low in density compared to the active region implant, the edge between these two regions will show up in the etch. That is, the structure in FIG. 3 will have a similar after-etch image independent of whether the structure forms is a true connection or a false connection (with channel 21 is doped with either n-type or p-type LDD dopant in the case of a n-type structure). Hence, using the structure of FIG. 3 in a circuit can make it difficult for the reverse engineer to determine the real connectivity of channel 21, particularly if a mixture of conducting and non-conducting LDD channels 21 are formed on a device having many instances of the structure shown in FIG. 3, some with the "correct" conductivity type in order to form a conducting channel and some with the "wrong" conductivity type in order to form a pseudo, non-conducting channel, which looks like a real conducting channel to the reverse engineer, but it is not conducting.

Using the LDD doping levels in the channel 21 provides the connection ambiguity discussed above. In contrast, using a full density doping in channel 21 would not provide the highly desirable ambiguity that fends off the reverse engineer because an LDD region is more ambiguous after etching where a stain may be used by the reverse engineer to try to determine the conductivity type of the regions and a lower density dosage gives a weaker response to stain and thus it is more difficult to distinguish n-type LLD regions from p-type LLD regions compared to distinguishing full density N+ and P+ regions. Also, full density regions butted together provide poor isolation as the diode junction is worse (it has a lower breakdown voltage) compared to the full density to LDD junction which occurs in the embodiment of FIG. 3 between the active regions and a non-conducting LDD channel 21. So the use of full density channels would be undesirable not only because their function (or lack of function) can be more easily discovered by a reverse engineer, but also because they can cause possible breakdown problems.

Having described the invention in connection with certain preferred embodiments thereof, modification will now certainly suggest itself to those skilled in the art. As such, the invention is not to be limited to the disclosed embodiments, except as is specifically required by the appended claims.

What is claimed is:

1. A method of making a semiconductor chip with improved resistance to reverse engineering, said method comprising:

a. forming a plurality of transistors in a semiconductor substrate, the transistors having sidewall spacers with LDD regions formed under the sidewall spacers and also having active regions, at least some of the active regions of certain ones of said transistors being disposed near adjacent active regions of certain other one of said transistors, a dopant density of the LDD regions being less than a dopant density of the active regions;

b. interconnecting the at least some active regions with adjacent active regions with ambiguous interconnection features, the ambiguous interconnection features each comprising a channel formed in the semiconductor substrate with a dopant density having the same dopant density as the dopant density of the LDD regions, with selected ones of the channels having a conductivity type supporting electrical communication and with other selected ones of the channels being formed of a conductivity type inhibiting electrical communication; and c. covering a portion of at least one channel formed in the semiconductor substrate and an adjacent active region with silicide, said at least one channel formed in the semiconductor substrate having a conductivity type which inhibits electrical communication with said adjacent active region at a junction, the silicide being disposed over said junction and providing an electrical connection to $V_{SS}$ for both said at least one channel formed in the semiconductor substrate and said adjacent active region.

2. A method of making a semiconductor chip with improved resistance to reverse engineering, said method comprising:

a. forming a plurality of transistors in a semiconductor substrate, the transistors having sidewall spacers with LDD regions formed under the sidewall spacers and also having active regions, at least some of the active regions of certain ones of said transistors being disposed near adjacent active regions of certain other one of said transistors, a dopant density of the LDD regions being less than a dopant density of the active regions;

b. interconnecting the at least some active regions with adjacent active regions with ambiguous interconnection features, the ambiguous interconnection features each comprising a channel formed in the semiconductor substrate with a dopant density having the same dopant density as the dopant density of the LDD regions, with selected ones of the channels having a conductivity type supporting electrical communication and with other selected ones of the channels being formed of a conductivity type inhibiting electrical communication; and c. covering a portion of at least one channel formed in the semiconductor substrate and an adjacent active region with silicide, said at least one channel formed in the semiconductor substrate having a conductivity type which inhibits electrical communication with said adjacent active region at a junction, the silicide being disposed over said junction and providing an electrical connection to $V_{DD}$ for both said at least one channel formed in the semiconductor substrate and said adjacent active region.

3. A method of electrically interconnecting active regions of two different transistors disposed on a semiconductor substrate, wherein the active regions of the two different transistors have different conductivity types, the method comprising:

providing a channel formed in the semiconductor substrate and formed between between the the active regions of the two different transistors to thereby form a junction with each of the active regions of the two different transistors having different conductivity types, the channel having a conductivity type which corresponds to only one of the active regions of the two different transistors; and disposing a layer of silicide over the junction between the channel and the one of the two different transistors which has a conductivity type which does not correspond to the conductivity type of the channel.

\* \* \* \* \*